(12) United States Patent
Gomez Arguello

(10) Patent No.: US 7,698,610 B2
(45) Date of Patent: Apr. 13, 2010

(54) TECHNIQUES FOR DETECTING OPEN INTEGRATED CIRCUIT PINS

(75) Inventor: Angel Maria Gomez Arguello, Campinas (BR)

(73) Assignee: Freescale Semiconductor, Inc., Austin, TX (US)

( * ) Notice: Subject to any disclaimer, the term of this patent is extended or adjusted under 35 U.S.C. 154(b) by 274 days.

(21) Appl. No.: 11/828,023

(22) Filed: Jul. 25, 2007

(65) Prior Publication Data

US 2009/0027059 A1  Jan. 29, 2009

(51) Int. Cl.
  *G01R 31/28* (2006.01)
(52) U.S. Cl. ..................................................... 714/724
(58) Field of Classification Search .................. 714/724; 324/537, 765, 771, 519, 763
  See application file for complete search history.

(56) References Cited

U.S. PATENT DOCUMENTS

| | | | | |
|---|---|---|---|---|
| 5,101,154 A | | 3/1992 | Hollstein et al. | |
| 5,254,953 A | * | 10/1993 | Crook et al. | 324/538 |
| 6,539,511 B1 | * | 3/2003 | Hashizume | 714/727 |
| 6,586,921 B1 | * | 7/2003 | Sunter | 324/76.11 |
| 6,590,412 B2 | * | 7/2003 | Sunter | 324/771 |
| 6,717,415 B2 | * | 4/2004 | Sunter | 324/519 |
| 7,492,170 B2 | * | 2/2009 | Crook et al. | 324/690 |

\* cited by examiner

*Primary Examiner*—James C Kerveros
(74) *Attorney, Agent, or Firm*—Dillon & Yudell LLP

(57) ABSTRACT

A technique of detecting an open integrated circuit (IC) pin includes selectively coupling a first open detect circuit, which includes a first inverter having a first threshold, to the IC pin. Next, a first logic state at an output of the first inverter is determined. Then, based upon the first logic state, it is determined whether the IC pin is open or whether it is indeterminate as to whether the IC pin is open. When it is indeterminate as to whether the IC pin is open, based on the first logic state, a second open detect circuit is selectively coupled to the IC pin. The second open detect circuit includes a second inverter having a second threshold (the first threshold is greater than the second threshold). A second logic state at an output of the second inverter is then determined. Finally, based upon the first and second logic states, it is determined whether the IC pin is open.

16 Claims, 5 Drawing Sheets

US 7,698,610 B2

TECHNIQUES FOR DETECTING OPEN INTEGRATED CIRCUIT PINS

BACKGROUND

1. Field

This disclosure relates generally to integrated circuits and, more specifically, to techniques for detecting open integrated circuit pins.

2. Related Art

One technique for detecting whether input pins of an integrated circuit (IC) are open, i.e., floating, has used an internal pull-up or pull-down resistor (connected to a defined voltage) on each of the input pins. According to this technique, a determination of whether an input pin is open has been made based on a voltage present on the input pin. However, when a pull-up or pull-down resistor is coupled to an input pin and the defined voltage is used for another circuit within the IC, the pull-up or pull-down resistor may create operational problems for the IC. For example, a pull-up or pull-down resistor on an input pin may modify the performance of an internal cell (of the IC) that is coupled to the input pin or adversely affect a voltage level of a desired input signal on the input pin.

U.S. Pat. No. 5,101,154 (hereinafter the '154 patent) is directed to an open bond detection circuit that is used to verify continuity through bonding wires connected between an external pin and a bonding pad of an integrated circuit (IC). The detection circuit of the '154 patent monitors a voltage potential developed across one or more bonding wires (i.e., metal conductors) connected between a bonding pad and an external pin to determine whether one or more of the bonding wires are open. The open bond detection circuit disclosed in the '154 patent is relatively complex, occupies a relatively large die area, and has relatively high current requirements.

With reference to FIG. 1, a circuit 100 is illustrated that employs a pull-up resistor Rpu between an internal voltage VDDi and an input pin of an integrated circuit (IC) 102 according to the prior art. As is shown, an external voltage Vext may be coupled to an input pin ch1 of the IC 102, via a resistive divider (including resistors R1 and R2). A parasitic external capacitance Cext is also shown coupled to the input pin ch1. In the circuit 100, when the input pin ch1 is open, i.e., when the external voltage Vext is not coupled to the input pin via the resistive divider, the external capacitor Cext charges to a level of the internal voltage VDDi through the pull-up resistor Rpu and, as such, a cell voltage Vc input to internal IC cell 104 transitions to the level of the internal voltage VDDi. In this case, control logic (not shown) detects an open on the input pin ch1 when the cell voltage Vc is approximately equal to the internal voltage VDDi. Unfortunately, coupling the input pin ch1 to the internal voltage VDDi via the pull-up resistor Rpu may adversely affect normal operation of the cell 104 and other circuits coupled to the input pin ch1.

With reference to FIG. 2, a circuit 200 is illustrated that employs a pull-down resistor Rpd to a common point (e.g. ground) on an input pin ch1 of an IC 202 according to the prior art. As is shown, an external voltage Vext may be coupled to the input pin ch1 of the IC 202, via a resistive divider (including the resistors R1 and R2). A parasitic external capacitance Cext is also shown coupled to the input pin ch1. In the circuit 200, when the input pin ch1 is open, i.e., when the external voltage Vext is not coupled to the input pin ch1 via the resistive divider, the external capacitor Cext discharges through the pull-down resistor Rpd and, as such, a cell voltage Vc input to internal IC cell 204 transitions to the value of the common point, e.g., zero volts. In this case, control logic (not shown) detects an open on the input pin ch1 when the cell voltage Vc is approximately equal to the level of the common point. Unfortunately, coupling the input pin ch1 to the common point via the pull-down resistor may adversely affect normal operation of the cell 204 and other circuits coupled to the input pin ch1.

What is needed is a technique for determining whether a pin of an integrated circuit is open that is relatively straight forward to implement and does not adversely affect operation of other external or internal circuits that are coupled to the pin during normal operation of the integrated circuit.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
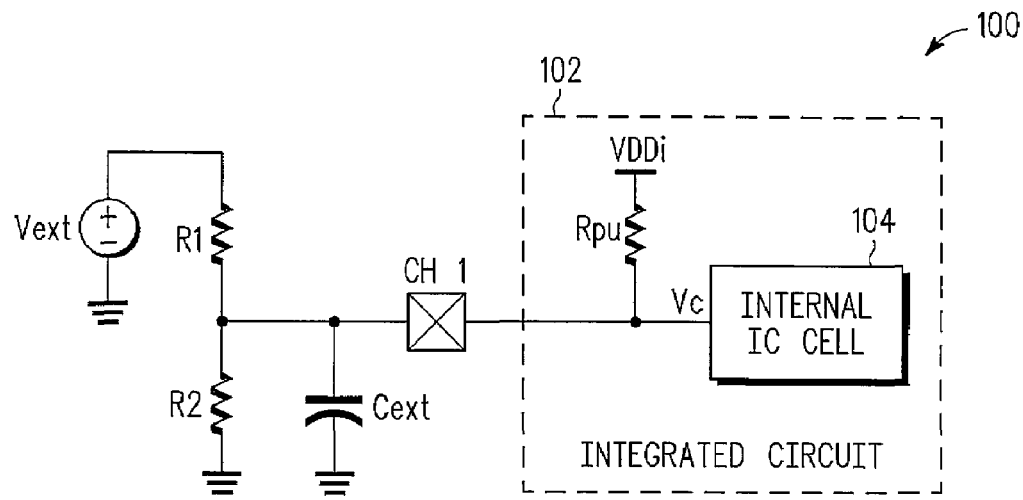
FIG. 1 is an electrical diagram, in block and schematic form, of a circuit that employs a pull-up resistor between an internal voltage and an input pin of an IC according to the prior art.
Figure 2:
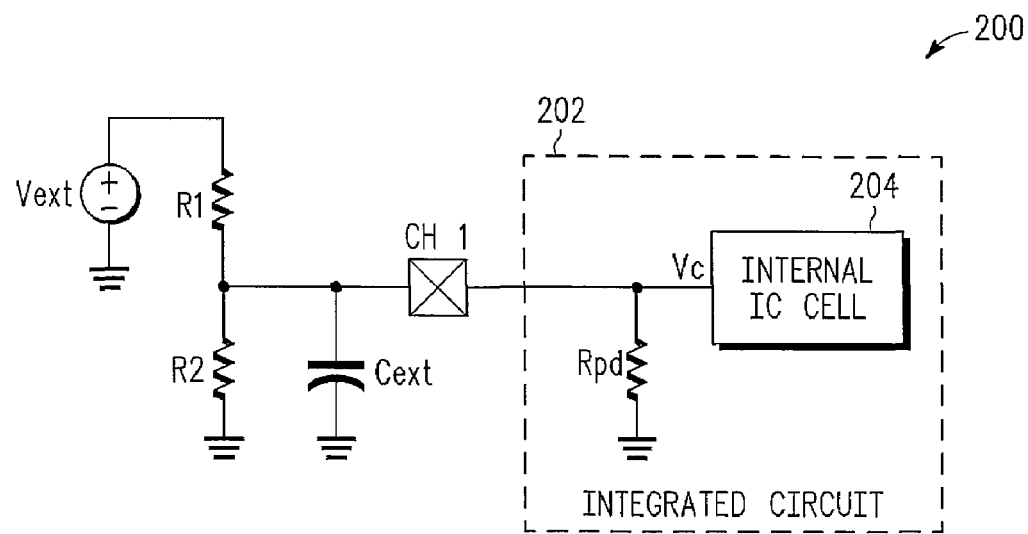
FIG. 2 is an electrical diagram, in block and schematic form, of a circuit that employs a pull-down resistor between a common point (e.g., ground) and an input pin of an IC circuit according to the prior art.

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined only by the appended claims and their equivalents. In particular, although the preferred embodiment is described below in conjunction with a subscriber station, such as a cellular handset, it will be appreciated that the present invention is not so limited and may be embodied in various integrated circuits incorporated in various devices, e.g., personal digital assistants (PDAs), digital cameras, portable storage devices, audio players, computer systems, and portable gaming devices, for example.

According to various aspects of the present disclosure, a two-phase open detect circuit is configured to replace a conventional pull-up and pull-down resistor. In a first phase (i.e., a pull-up phase), the open detect circuit is configured to selectably provide a pull-up current (via, for example, a pull-up resistor or a current source) to an input pin. The signal on the input pin is coupled to an input of a first inverter that includes an n-channel metal-oxide semiconductor field-effect transistor (MOSFET) and a p-channel MOSFET. In one embodiment, a width-to-length ratio of the n-channel MOSFET is substantially less (e.g., about ten times less) than a width-to-length ratio of the p-channel MOSFET (i.e., Wn/Ln<<Wp/Lp, where Wn corresponds to a width of the n-channel MOSFET, Ln corresponds to a length of the n-channel MOSFET, Wp corresponds to a width of the p-channel MOSFET, and Lp corresponds to a length of the p-channel MOSFET). If the input pin is not externally connected to another component, a voltage on the input pin transitions to an internal voltage VDDi level and an output of the first inverter transitions to a low logic state, i.e., '0'. If the input pin is externally connected to another component and a Thevenin voltage (Vthev) on the input pin is less than VDDi/2, the output of the first inverter transitions to a high logic state, i.e., '1'.

In a second phase (i.e., a pull-down phase), the open detect circuit is configured to selectively provide a pull-down current (provided via, for example, a pull-down resistor or a current source) to the input pin. In this embodiment, the signal on the input pin is coupled to an input of a second inverter that includes an n-channel MOSFET and a p-channel MOSFET. A width-to-length ratio of the n-channel MOSFET is substantially greater (e.g., about ten times greater) than a width to length ratio of the p-channel MOSFET (i.e., Wn/Ln>>Wp/Lp, where Wn corresponds to a width of the n-channel MOSFET, Ln corresponds to a length of the n-channel MOSFET, Wp corresponds to a width of the p-channel MOSFET, and Lp corresponds to a length of the p-channel MOSFET). If the input pin is not externally connected to a component, a voltage on the input pin transitions to a low logic state (i.e., '0') and an output of the second inverter transitions to a high logic state, i.e., '1'. If the input pin is externally connected to another component and the Thevenin voltage (Vthev) on the input pin is greater than VDDi/2, an output of the second inverter transitions to a low logic state, e.g., '0'. In this embodiment, control logic monitors the outputs of the first and second inverters to determine whether the input pin is open.

According to one aspect of the present disclosure, a technique for detecting an open integrated circuit (IC) pin includes selectively coupling a first open detect circuit, which includes a first inverter having a first threshold, to the IC pin. Next, a first logic state at an output of the first inverter is determined, when the first open detect circuit is coupled to the IC pin. Finally, it is determined, based upon the first logic state, whether the IC pin is open.

According to another aspect of the present disclosure, a technique for detecting an open integrated circuit (IC) pin includes selectively coupling a first open detect circuit, which includes a first inverter having a first threshold, to the IC pin. Next, a first logic state at an output of the first inverter is determined, when the first open detect circuit is coupled to the IC pin. Then, a second open detect circuit, which includes a second inverter having a second threshold, is selectively coupled to the IC pin. In this embodiment, the first threshold is greater than the second threshold. Next, a second logic state at an output of the second inverter is determined, when the second open detect circuit is coupled to the IC pin. Finally, it is determined, based upon the first and second logic states, whether the IC pin is open.

According to a different aspect of the present disclosure, an integrated circuit (IC) includes an internal cell, a first open detect circuit, and control logic. The internal cell is coupled to an input pin of the IC. The first open detect circuit, which includes a first inverter having a first threshold, is configured to be selectively coupled to the input pin. The control logic includes a first input coupled to an output of the first inverter and is configured to determine a first logic state at the output of the first inverter, when the first open detect circuit is coupled to the input pin. The control logic is also configured to determine, based upon the first logic state, whether the input pin is open.

Figure 3:
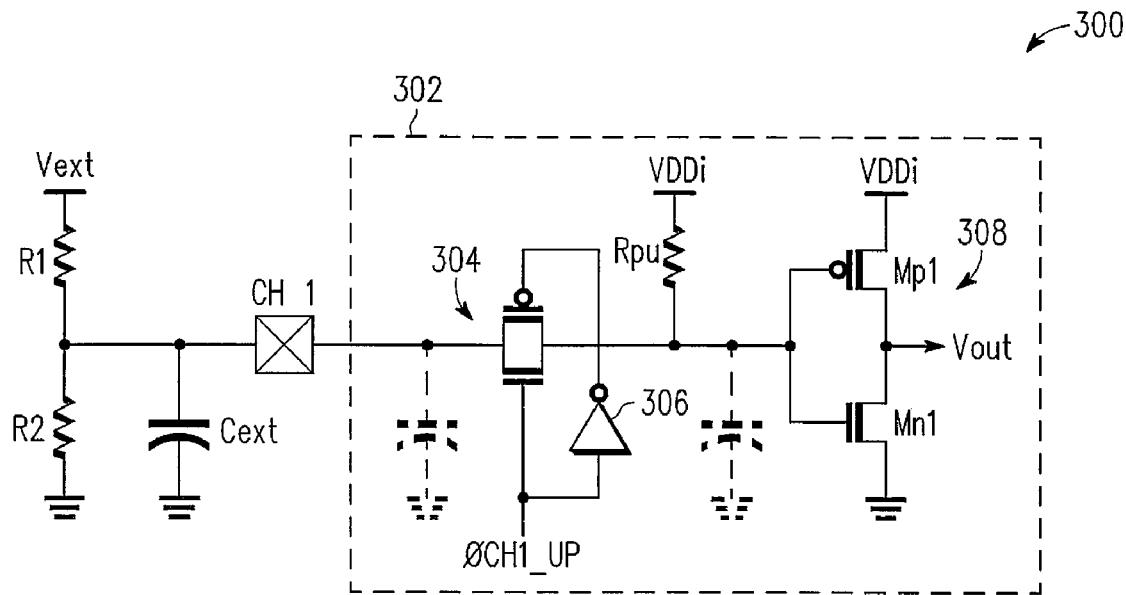
FIG. 3 is an electrical diagram, in block and schematic form, of a relevant portion of an open detect circuit that selectively couples an internal pull-up resistor between an internal voltage and an input pin (that may be coupled to an external resistive divider) of an IC, according to an embodiment of the present disclosure.

With reference to FIG. 3, a selectable pull-up circuit 300 is illustrated that selectively couples an input pin ch1 of an integrated circuit (IC) 302 to an internal voltage VDDi via a pull-up resistor Rpu according to one embodiment of the present disclosure. The IC 302 may include, for example, a switched-type analog-to-digital converter (ADC) that is employed in a subscriber station. In a switched-type ADC, coupling a pull-up resistor between an input pin and an internal supply voltage (during normal operation of the ADC) may cause switching problems in the ADC. As is shown, an external voltage Vext may be coupled to the input pin ch1 of the IC 302, via a resistive divider (including resistors R1 and R2). A parasitic external capacitance Cext is also shown coupled to the input pin ch1. Internal to the IC 302, the input pin ch1 is coupled to a first terminal of pass gate 304. A second terminal of the pass gate 304 is coupled to one-side of the pull-up resistor Rpu and an input of inverter 308 (includes a p-channel MOSFET Mp1 and an n-channel MOSFET Mn1). An output of the inverter 308 provides an output signal Vout, which is used to determine whether the input pin ch1 is open. In this embodiment, a width-to-length ratio of the n-channel MOSFET Mn1 is substantially less (e.g., about ten times less) than a width-to-length ratio of the p-channel MOSFET Mp1 (i.e., Wn/Ln<<Wp/Lp, where Wn corresponds to a width of the n-channel MOSFET, Ln corresponds to a length of the n-channel MOSFET, Wp corresponds to a width of the p-channel MOSFET, and Lp corresponds to a length of the p-channel MOSFET). An input of an inverter 306 is coupled to a first control terminal of the pass gate 304 and an output of the inverter 306 is coupled to a second control terminal of the pass gate 304.

Figure 4:
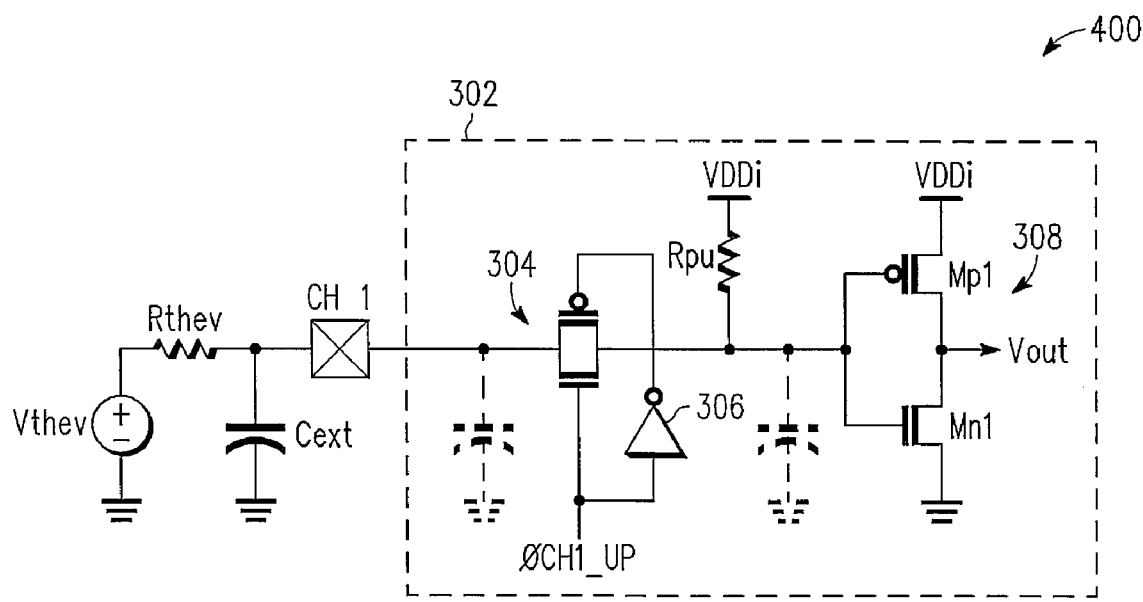
FIG. 4 is an electrical diagram, in block and schematic form, of the open detect circuit of FIG. 3 with a Thevenin equivalent input circuit of the external resistive divider.

In the circuit 300, when the input pin ch1 is open, i.e., when the external voltage Vext is not coupled to the input pin via the resistive divider and the pass gate 304 is turned on, the external capacitor Cext charges to the internal voltage VDDi through the pull-up resistor Rpu and the output voltage Vout at an output of the inverter 308 transitions to low logic state, i.e., a '0'. During a first phase, the pass gate 304 is selectively turned on when a pull-up control signal (0ch1_up) is asserted. The pull-up control signal (0ch1_up) is provided to the first control terminal (gate) of the first switch (n-channel MOSFET) of the pass gate 304 and the input of the inverter 306. Following an open circuit detect determination, the pass gate 304 is turned off, which effectively disconnects the pull-up resistor Rpu from the input pin ch1, such that the operation of other circuits coupled to the input pin are not adversely affected during normal operation. With reference to FIG. 4, an open detect circuit 400 illustrates a Thevenin equivalent circuit for the external voltage Vext and the resistive divider. A Thevenin voltage (Vthev) is equal to Vext*(R2/(R1+R2)) and a Thevenin resistor (Rthev) is equal to (R1*R2)/(R1+R2). In this embodiment, when Vthev is equal to VDDi/2 the inverter 308 is designed such that the output voltage Vout of the inverter 308 changes to a high logic state, i.e., a '1', for all corner processes, bias, and temperatures. In this case, the circuit 400 indicates that a component is externally connected to the input pin ch1 (i.e., Vout is in a high logic state), when the Thevenin voltage Vthev is less than or equal to VDDi/2. However, depending upon the values chosen for the resistors R1 and R2 and the external voltage Vext, the Thevenin voltage Vthev may be greater than VDDi/2 when an external component is connected to the input pin ch1. When the Thevenin voltage Vthev is greater than VDDi/2, the output of the inverter 308 is more likely to transition to a low logic state, i.e., a '0' (Vthev voltages greater than VDDi/2, but close to VDDi/2, can cause the output of the inverter 308 to transition to a high logic state, i.e., a '1', due to the fact that Wn/Ln<<Wp/Lp).

Figure 5:
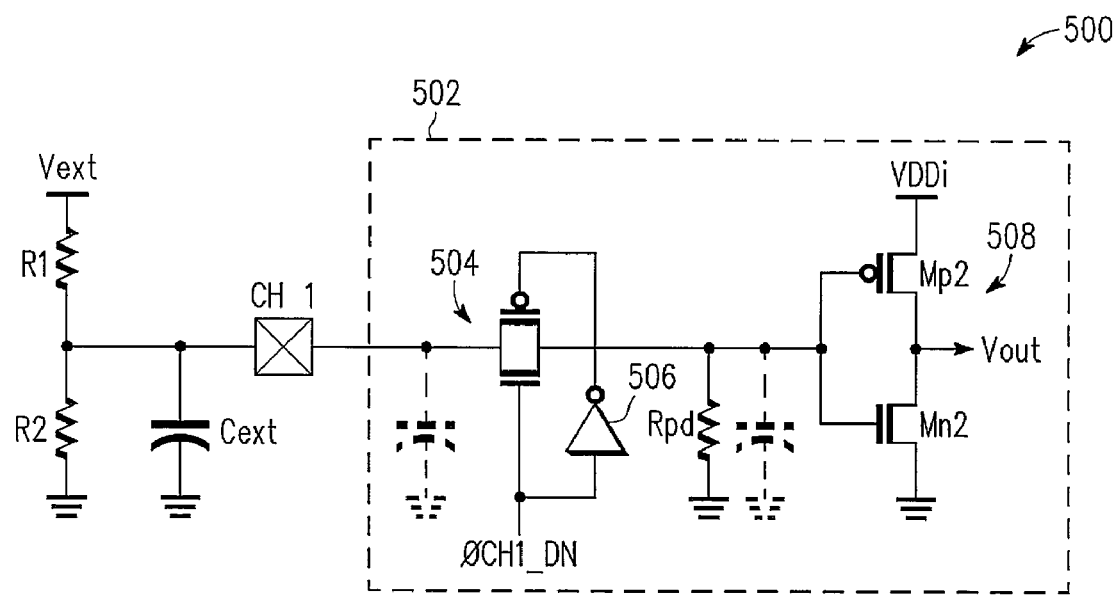
FIG. 5 is an electrical diagram, in block and schematic form, of a relevant portion of an open detect circuit that selectively couples an internal pull-down resistor between a common point (e.g., ground) and an input pin (that may be coupled to an external resistive divider) of an IC, according to an embodiment of the present disclosure.

To account for the case in which the Thevenin voltage Vthev is greater than VDDi/2 and the input pin ch1 is not open (i.e., one or more external components are coupled to the input pin), a pull-down resistor may be selectively coupled to the input pin ch1 during a second phase. With reference to FIG. 5, a selectable pull-down circuit 500 is illustrated that selectively couples an input pin ch1 of an integrated circuit (IC) 502 to a common point (e.g., ground) via a pull-down resistor (Rpd) according to another embodiment of the present disclosure. As is shown, an external voltage Vext may be coupled to the input pin ch1 of the IC 502, via a resistive divider (including the resistors R1 and R2). A parasitic external capacitance Cext is also shown coupled to the input pin ch1. Internal to the IC 502, the input pin ch1 is coupled to a first terminal of pass gate 504. A second terminal of the pass gate 504 is coupled to one-side of the pull-down resistor Rpd and an input of inverter 508, which includes an n-channel MOSFET Mn2 and a p-channel MOSFET Mp2. A width-to-length ratio of the n-channel MOSFET Mn2 is substantially greater (e.g., about ten times greater) than a width-to-length ratio of the p-channel MOSFET Mp2 (i.e., Wn/Ln>>Wp/Lp, where Wn corresponds to a width of the n-channel MOSFET, Ln corresponds to a length of the n-channel MOSFET, Wp corresponds to a width of the p-channel MOSFET, and Lp corresponds to a length of the p-channel MOSFET). An output of the inverter 508 provides an output signal Vout, which is used to determine whether the input pin ch1 is open. An input of an inverter 506 is coupled to a first control terminal of the pass gate 504 and an output of the inverter 506 is coupled to a second control terminal of the pass gate 504.

Figure 6:
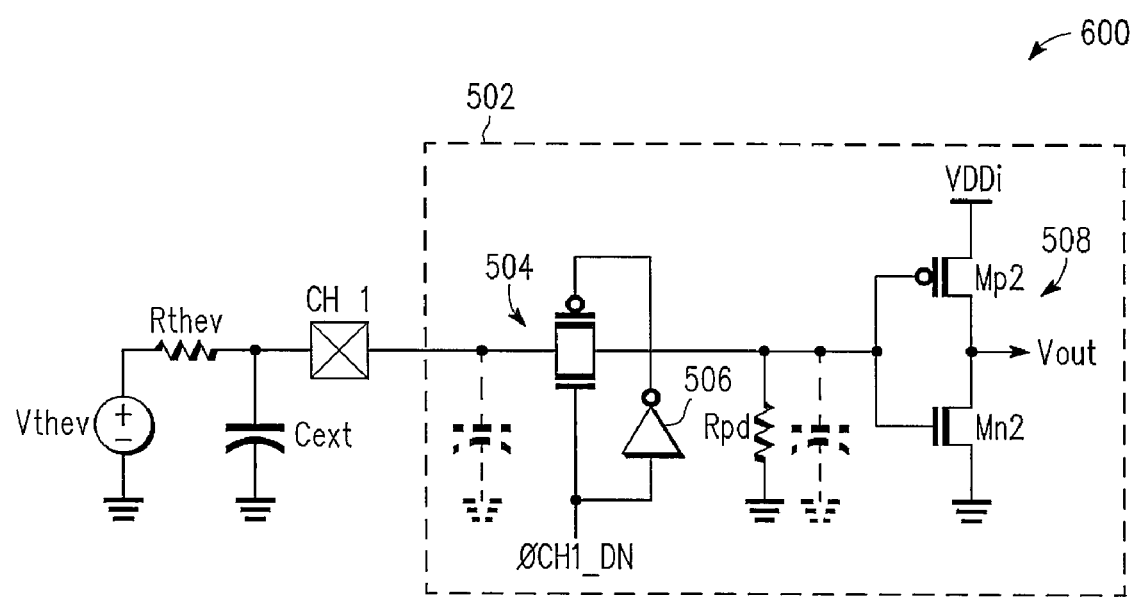
FIG. 6 is an electrical diagram, in block and schematic form, of the open detect circuit of FIG. 5 with a Thevenin equivalent input circuit of the external resistive divider.

In the circuit 500, when the input pin ch1 is open, i.e., when the external voltage Vext is not coupled to the input pin ch1 via the resistive divider, and the pass gate 504 is turned on, the external capacitor Cext discharges through the pull-down resistor Rpd and the output voltage Vout at the output of the inverter 508 transitions to a high logic state, i.e., a '1'. The pass gate 504 is selectively turned on when a pull-down control signal (0ch1_) is asserted. The pull-down control signal (0ch1_) is provided to the first control terminal of the pass gate 504 and is provided to the input of the inverter 506. Following the second phase open circuit detect determination, the pass gate 504 is turned off, which effectively disconnects the pull-down resistor Rpd from the input pin ch1, such that the operation of other circuits, if any, coupled to the input pin ch1 are not adversely affected during normal operation. With reference to FIG. 6, an open detect circuit 600 illustrates a Thevenin equivalent circuit for the external voltage Vext and the resistive divider. A Thevenin voltage (Vthev) is equal to Vext*(R2/(R1+R2)) and a Thevenin resistor (Rthev) is equal to (R1*R2)/(R1+R2). In this embodiment, when the Thevenin voltage Vthev is equal to VDDi/2, the inverter 508 is designed such that the output voltage Vout of the inverter 508 transitions to a low logic state, i.e., a '0', for all corner processes, bias, and temperatures. In this case, the circuit 600 indicates that a component is externally connected to the input pin ch1 (i.e., Vout is in a low logic state) when the Thevenin voltage Vthev is greater than or equal to VDDi/2. When the Thevenin voltage Vthev is less than VDDi/2, the output voltage of the inverter 508 is more likely to transition to a high logic state, i.e., a '1' (Vthev voltages less than VDDi/2, but close to VDDi/2, can cause the output of the inverter 508 to transition to a low logic state, i.e., a '0', due to the fact that Wn/Ln>>Wp/Lp). However, scenarios of Vthev less than VDDi/2 were covered in the first phase. If during the first phase the output of inverter 308 is in a high logic state, i.e., a '1', determining the logic state of the output of the inverter 508 in the second phase is not necessary.

Figure 7:
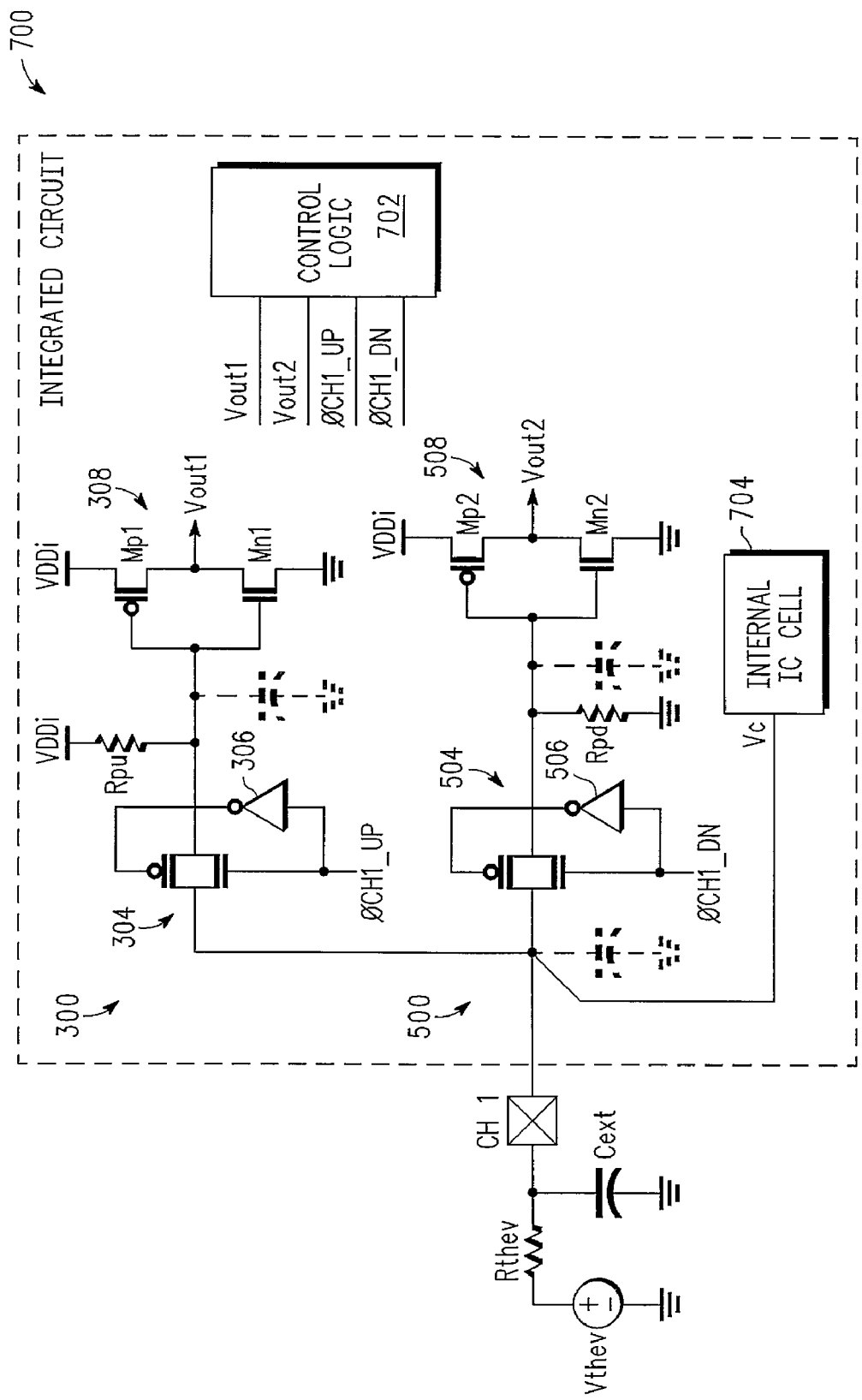
FIG. 7 is an electrical diagram, in block and schematic form, of a relevant portion of an open detect circuit that selectively couples an internal pull-up resistor between an internal voltage and an input pin (that may be coupled to an external resistive divider) of an IC and that selectively couples a pull-down resistor between a common point (e.g., ground) and the input pin, according to an embodiment of the present disclosure.

With reference to FIG. 7, an integrated circuit (IC) 700 is illustrated that includes an open detect circuit (which includes the selectable pull-up circuit 300 of FIG. 3 and the selectable pull-down circuit 500 of FIG. 5). Appropriate portions of the open detect circuit are selectively coupled to the input pin ch1 to determine whether the input pin ch1 is externally connected to one or more other components or is open. The IC 700 also includes control logic 702, which includes outputs that respectively provide a pull-up control signal (0ch1_up) and a pull-down control signal (0ch_dn) to selectively connect the circuit 300 and the circuit 500 to the input pin ch1 to determine whether an external component is connected to the input pin ch1. Thee control logic 702 includes inputs coupled to the respective outputs of the inverters 308 and 508. The control logic 702 monitors an appropriate one of the inputs when providing the pull-up and pull-down control signals to determine whether one or more external components are connected to the input pin ch1. In a typical implementation, the control logic 702 may include respective comparators with thresholds set to appropriate values to provide an indication of logic states at the respective outputs of the inverters 308 and 508. Alternatively, the control logic 702 may be configured to measure a voltage level at the outputs of the inverters 308 and 508. In another embodiment, the control logic 702 takes the form of a processor that executes a software system.

Figure 8:
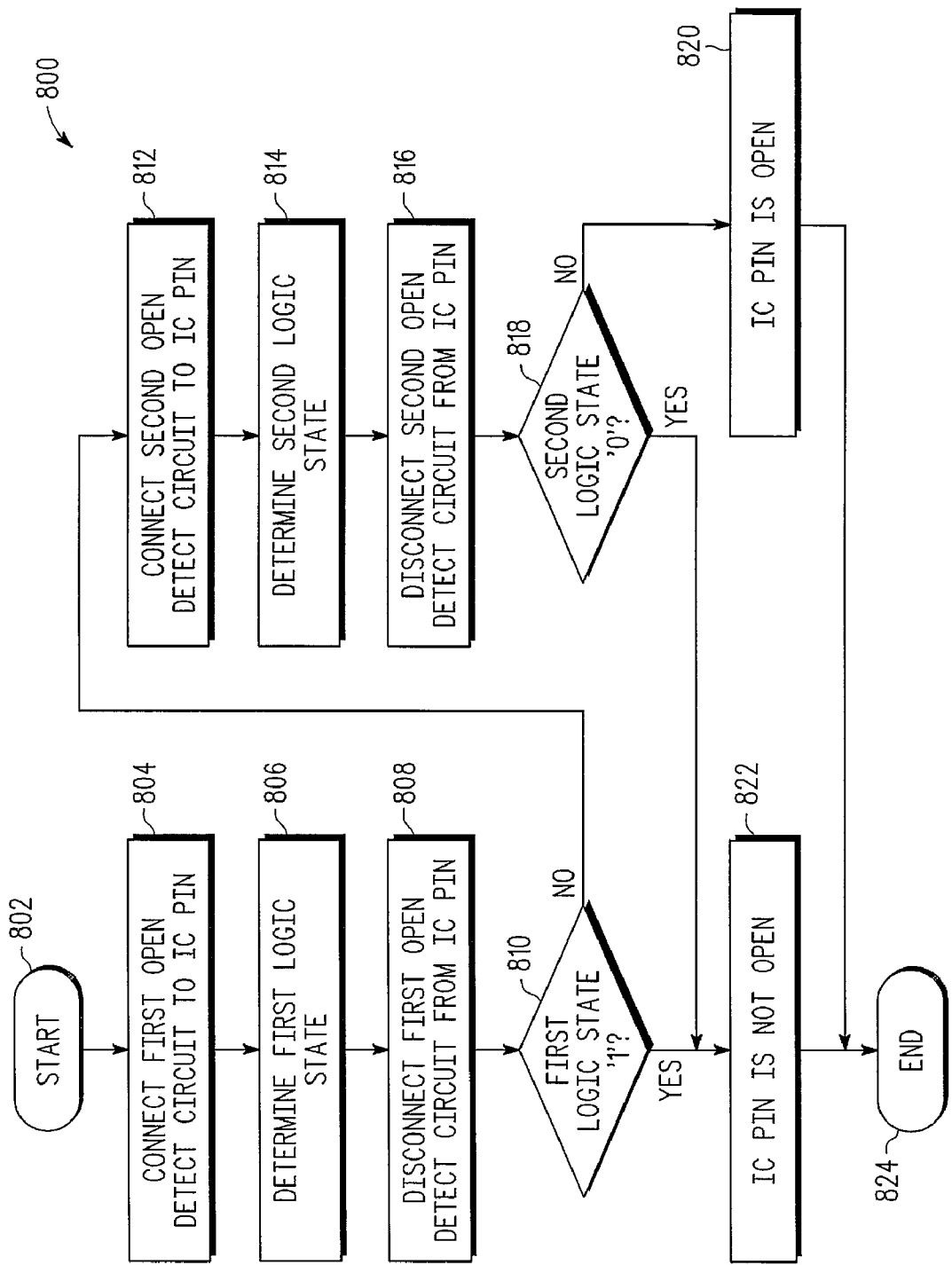
FIG. 8 shows a flow chart of a process for detecting an open on a pin of an IC according to an embodiment of the present disclosure.

With reference to FIG. 8, an example open detect process 800 is illustrated for detecting an open integrated circuit (IC) pin. The process 800 is initiated in block 802, at which point control transfers to block 804. In block 804, a first open detect circuit (selectable pull-up circuit) 300, which includes a first inverter 308 having a first threshold, is connected to the IC pin. Next, in block 806, a first logic state at an output of the first inverter 308 is determined by control logic 702. Then, in block 808, the first open detect circuit 300 is disconnected from the IC pin. Next, in decision block 810, the control logic 702 determines whether the first logic state is a digital '1'. If the first logic state is a digital '1', control transfers to block 822 where an indication of 'not open' is returned.

If the first logic state is a digital '0' in block 810, it is indeterminate as to whether the IC pin is open or coupled to one or more external components. In this case, control transfers from block 810 to block 812, where a second open detect circuit (selectable pull-down circuit) 500, which includes a second inverter 508 having a second threshold, is connected to the IC pin. In this embodiment, the first threshold is greater than the second threshold. Next, in block 814, a second logic state at an output of the second inverter 508 is determined. Then, in decision block 816, the second open detect circuit 500 is disconnected from the IC pin. Next, in decision block 818, the control logic 702 determines whether the second logic state is a digital '0'. If the second logic state is a digital '0', control transfers from block 818 to block 822 where an indication of 'not open' is returned. If the second logic state is a digital '1' in block 818, control transfers to block 820, where an indication of 'open' is returned. From blocks 820 and 822 control transfers to block 824, where the process 800 terminates.

In sum, an open detect circuit has been described herein that implements respective inverters (with respective thresholds) to detect a voltage level on an input pin during a pull-up phase and a pull-down phase. The open detect circuit may be employed in a wide variety of applications. For example, the open detect circuit may be implemented on input pins of a sigma delta analog-to-digital converter (ADC), where a circuit designer has the option to leave an input pin open or connect the input pin to an external node via a resistive divider. While the disclosure herein has focused on detecting opens on input pins of an integrated circuit, it is contemplated that techniques disclosed herein are broadly applicable to detecting opens on input pins, output pins, and input/output (I/O) pins of an integrated circuit.

Accordingly, an open detect circuit has been described herein that employs a pull-up phase and a pull-down phase to determine whether a pin of an integrated circuit is open. In the pull-up phase, an external parasitic capacitance is charged. If the pin is open, the parasitic capacitance charges to an internal voltage level. In the pull-down phase, the external parasitic capacitance is discharged. If the pin is open, the parasitic capacitance discharges to a common point (e.g., ground). The signals generated in the two phases are processed by control logic to acquire information that facilitates the determination of whether the pin is open or connected to one or more external components. Following the determination of whether the pin is open or connected to one or more other component, the open detect circuit can be disconnected from the pin so as to not adversely affect the operation of any internal circuit that is coupled to the pin or a desired external operation point on the pin when, for example, an external resistive divider is coupled to the pin.

As used herein, a software system can include one or more objects, agents, threads, subroutines, separate software applications, two or more lines of code or other suitable software structures operating in one or more separate software applications, on one or more different processors, or other suitable software architectures.

As will be appreciated, the processes in preferred embodiments of the present invention may be implemented using any combination of computer programming software, firmware or hardware. As a preparatory step to practicing the invention in software, the computer programming code (whether software or firmware) according to a preferred embodiment will typically be stored in one or more machine readable storage mediums such as fixed (hard) drives, diskettes, optical disks, magnetic tape, semiconductor memories such as read-only memories (ROMs), programmable ROMs (PROMs), etc., thereby making an article of manufacture in accordance with the invention. The article of manufacture containing the computer programming code is used by either executing the code directly from the storage device, by copying the code from the storage device into another storage device such as a hard disk, random access memory (RAM), etc., or by transmitting the code for remote execution. The method form of the invention may be practiced by combining one or more machine-readable storage devices containing the code according to the present disclosure with appropriate standard computer hardware to execute the code contained therein. An apparatus for practicing the techniques of the present disclosure could be one or more computers and storage systems containing or having network access to computer program(s) coded in accordance with the present disclosure.

Although the invention is described herein with reference to specific embodiments, various modifications and changes can be made without departing from the scope of the present invention as set forth in the claims below. For example, in certain applications, it is contemplated that the inverters may be constructed from different device types, e.g., bipolar junction transistors (BJTs). Accordingly, the specification and figures are to be regarded in an illustrative rather than a restrictive sense, and all such modifications are intended to be included with the scope of the present invention. Any benefits, advantages, or solution to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of detecting an open integrated circuit pin, comprising:
    selectively coupling a first open detect circuit to an integrated circuit pin, the first open detect circuit including a first inverter having a first threshold;
    determining a first logic state at an output of the first inverter when the first open detect circuit is coupled to the integrated circuit pin;
    determining, based upon the first logic state, whether the integrated circuit pin is open;
    selectively coupling a second open detect circuit to the integrated circuit pin, the second open detect circuit including a second inverter having a second threshold, wherein the first threshold is greater than the second threshold;
    determining a second logic state at an output of the second inverter when the second open detect circuit is coupled to the integrated circuit pin; and
    determining, based upon the first and second logic states, whether the integrated circuit pin is open.

2. The method of claim 1, wherein the first open detect circuit includes a first resistor coupled between an input of the first inverter and a first reference voltage and the second open detect circuit includes a second resistor coupled between an input of the second inverter and a second reference voltage.

3. The method of claim 1, wherein the first open detect circuit includes a first current source coupled to an input of the first inverter and the second open detect circuit includes a second current source coupled to an input of the second inverter.

4. The method of claim 1, wherein the determining a first logic state at an output of the first inverter further comprises measuring a first output voltage at the output of the first inverter and the determining a second logic state at an output of the second inverter further comprises measuring a second output voltage at the output of the second inverter.

5. The method of claim 1, wherein the integrated circuit pin is open when the first logic state is a digital zero and the second logic state is a digital one.

6. A method of detecting an open integrated circuit pin, comprising:
   selectively coupling a first open detect circuit to an integrated circuit pin, the first open detect circuit including a first inverter having a first threshold;
   determining a first logic state at an output of the first inverter when the first open detect circuit is coupled to the integrated circuit pin;
   selectively coupling a second open detect circuit to the integrated circuit pin, the second open detect circuit including a second inverter having a second threshold, wherein the first threshold is greater than the second threshold;
   determining a second logic state at an output of the second inverter when the second open detect circuit is coupled to the integrated circuit pin; and
   determining, based upon the first and second logic states, whether the integrated circuit pin is open.

7. The method of claim 6, wherein the first open detect circuit includes a first resistor coupled between an input of the first inverter and a first reference voltage and the second open detect circuit includes a second resistor coupled between an input of the second inverter and a second reference voltage.

8. The method of claim 6, wherein the determining a first logic state at an output of the first inverter further comprises:
   measuring a first output voltage at the output of the first inverter.

9. The method of claim 6, wherein the determining a second logic state at an output of the second inverter further comprises:
   measuring a second output voltage at the output of the second inverter.

10. The method of claim 6, wherein the integrated circuit pin is an input pin.

11. The method of claim 6, wherein the integrated circuit pin is open when the first logic state is a digital zero and the second logic state is a digital one.

12. The method of claim 6, further comprising:
   decoupling the first and second open detect circuits from the integrated circuit pin during normal operation of an associated integrated circuit; and
   receiving data on the integrated circuit pin when the first and second open detect circuits are decoupled from the integrated circuit pin.

13. An integrated circuit, comprising:
   an internal cell coupled to an input pin of the integrated circuit;
   a first open detect circuit configured to be selectively coupled to the input pin, the first open detect circuit including a first inverter having a first threshold;
   control logic including a first input coupled to an output of the first inverter, wherein the control logic is configured to determine a first logic state at the output of the first inverter when the first open detect circuit is coupled to the input pin, and wherein the control logic is configured to determine, based upon the first logic state, whether the input pin is open; and
   a second open detect circuit configured to be selectively coupled to the input pin, the second open detect circuit including a second inverter having a second threshold, wherein the first threshold is greater than the second threshold and the control logic includes a second input coupled to an output of the second inverter, and wherein the control logic is configured to determine a second logic state at the output of the second inverter when the second open detect circuit is coupled to the input pin, where the control logic is configured to determine, based upon the first and second logic states, whether the input pin is open.

14. The integrated circuit of claim 13, wherein the first open detect circuit includes a first resistor coupled, between an input of the first inverter and a first reference voltage and the second open detect circuit includes a second resistor coupled between an input of the second inverter and a second reference voltage.

15. The integrated circuit of claim 13, wherein the first open detect circuit includes a first pass gate configured to selectively couple the first open detect circuit to the input pin and the second open detect circuit includes a second pass gate configured to selectively couple the second open detect circuit to the input pin.

16. The integrated circuit of claim 13, wherein the first inverter includes a first n-channel metal-oxide semiconductor field-effect transistor and a first p-channel metal-oxide semiconductor field-effect transistor and the second inverter includes a second n-channel metal-oxide semiconductor field-effect transistor and a second p-channel metal-oxide semiconductor field-effect transistor, and wherein a width-to-length ratio of the first n-channel metal-oxide semiconductor field-effect transistor is at least about ten times less than a width-to-length ratio of the first p-channel metal-oxide semiconductor field-effect transistor and a width-to-length ratio of the second n-channel metal-oxide semiconductor field-effect transistor is at least about ten times greater than a width-to-length ratio of the second p-channel metal-oxide semiconductor field-effect transistor.

\* \* \* \* \*